United States Patent [19]
Lee et al.

[11] Patent Number: 5,879,450
[45] Date of Patent: Mar. 9, 1999

[54] METHOD OF HETEROEPITAXIAL GROWTH OF BETA SILICON CARBIDE ON SILICON

[75] Inventors: Shuit Tong Lee; Chun Sing Lee; Bello Igor; Yat Wah Lam; Hin Koon Woo, all of Hong Kong, Hong Kong

[73] Assignee: City University of Hong Kong, Hong Kong

[21] Appl. No.: 910,205

[22] Filed: Aug. 13, 1997

[51] Int. Cl.[6] .................................................. C30B 25/00
[52] U.S. Cl. ..................... 117/88; 118/723 HC; 118/725; 118/724; 117/108; 117/951
[58] Field of Search .................... 117/951, 217, 117/218, 222, 935, 937, 105, 108, 88; 118/723 HC, 725, 724, 726

[56] References Cited

U.S. PATENT DOCUMENTS

| | | | |
|---|---|---|---|
| 4,664,944 | 5/1987 | Hsu | 117/951 |
| 4,855,254 | 8/1989 | Eshita | 117/951 |
| 4,912,063 | 3/1990 | Davis | 117/951 |
| 4,912,064 | 3/1990 | Kong | 117/951 |
| 5,288,365 | 2/1994 | Furukawa | 117/951 |
| 5,406,906 | 4/1995 | Rimari | 117/92 |

FOREIGN PATENT DOCUMENTS

| | | |
|---|---|---|
| 5-304114 | 11/1993 | Japan . |
| 6-168905 | 6/1994 | Japan . |

OTHER PUBLICATIONS

Powell, J.A. et al, "Growth of high quality 6H–SiC epitaxial films on vicinal (0001) 6H–SiC wafers", Appl. Phys. Lett., vol. 56, No. 15, 9 Apr. 1990, pp. 1442–1444.

Rimai, L. et al, "Preparation of oriented silicon carbide films by laser ablation of ceramic silicon carbide targets", Appl. Phys. Lett., vol. 59, No. 18, 28 Oct. 1991, pp. 2266–2268.

*Primary Examiner*—Robert Kunemund
*Assistant Examiner*—Evelyn Defillo
*Attorney, Agent, or Firm*—Burns, Doane, Swecker & Mathis

[57] ABSTRACT

A method and an apparatus have been developed to deposit heteroepitaxial beta-silicon carbide films on silicon using bias-assisted hot filament chemical vapor deposition (BA-HFCVD). The apparatus includes a graphite plate as the carbon source and the silicon substrate as the silicon source. Hydrogen was the only feeding gas to the system.

13 Claims, 28 Drawing Sheets

METHOD OF HETEROEPITAXIAL GROWTH OF BETA SILICON CARBIDE ON SILICON

FIELD OF INVENTION

The present invention relates to a method and an apparatus for epitaxial growth of beta silicon carbide (β-SiC) film on silicon by hot filament chemical vapour deposition (HFCVD).

BACKGROUND OF THE INVENTION

Silicon carbide is a promising material for high temperature, high power and radiation resistive electronic devices. This application is due to its unique properties of large band gap, high break down electric field, high electron mobility and high thermal conductivity. SiC exhibits more than 250 polytypes, in either hexagonal (α) or cubic (β) form, depending on the stacking order of silicon and carbon atoms. Among these polytypes, 6H-SiC has received more attention because it is easier to prepare.

Various growth techniques, including chemical vapour deposition (CVD) and physical vapour deposition (PVD) have been reported to successfully provide oriented growth of β-SiC. For example, Powell et al. (Applied Physics Letter, 56, p. 1442, 1990) have reported oriented growth of β-SiC on silicon using microwave CVD with $SiH_4$, $C_3H_8$, and $H_2$ as the feeding gases. However, this process requires a high substrate temperature (>1300° C.) which is quite close to the melting point of silicon. This can result in film contamination and hydrogen incorporation. Besides, a deposition system of very high safety standard is required because propane is flammable and silane is pyrophoric. On the other hand, Rimai et al. (Applied Physics Letter, 59, p. 2266, 1991) reported epitaxially oriented growth of β-SiC by laser ablation of a ceramic SiC target at a substrate temperature held below 1100° C. While this method does not suffer from the problems of the microwave CVD method, large area β-SiC film cannot be produced.

The present invention provides a method for producing large area heteroepitaxial β-SiC films on silicon at a lower substrate temperature without using flammable and toxic gas sources.

SUMMARY OF INVENTION

It is an object of the present invention to provide a method and an apparatus for the growth of beta-silicon carbide films on the silicon substrate.

It is another object of the invention to provide a method and an apparatus for the heteroepitaxial growth of beta-silicon carbide film on silicon substrates that may be performed in-situ in a vacuum hot filament CVD chamber.

In a more specific aspect of the present invention, it provides a method and an apparatus for growing epitaxial beta-silicon carbide films on silicon by electrically biasing the substrate during the growth period.

According to the present invention therefore there is provided a method for the growth of a beta-silicon carbide film on a silicon substrate by chemical vapour deposition, comprising the steps of using solid carbon as the carbon source and using solid silicon as the silicon source, and using $H_2$ as the reactant gas and a hot filament as a means of gaseous activation.

The silicon source may be a piece of solid silicon located adjacent the carbon source, but preferably the silicon substrate itself is used as the silicon source. In a preferred embodiment the substrate may be supported on a substrate holder that is electrically biased. The substrate holder is preferably biased at a peak value of not less than about 200 volts negative with respect to the filaments. The electrical bias supplied to the substrate holder may either be pure DC, pulsed DC, AC, or radio frequency (rf), provided that the least portion of the electrical bias waveform is more than 400 volts.

Preferably, the carbon source is graphite, more preferably in the form of a plate that is placed not more than 4 mm away from the filaments, and the substrate is placed no more than 4 mm from the filaments. The substrate holder may be movable to adjust the relative positions of the silicon substrate and the graphite source.

During the growth period (biasing period), the pressure in the reaction chamber may be maintained at about 1 to 500 Torr, and preferably at about 10 Torr, and the substrate maintained at a temperature of about 900° to 1100° C., and preferably at 1000° C.

It has been found that the growth period is preferably carried out for a period of time in the range between 5 mins to 90 mins. Prolonged growth will result in diamond/carbon formation. The electrical bias should be stopped after the growth period.

According to the invention there is also provided apparatus for the chemical vapour deposition of a beta-silicon carbide film on a silicon substrate, comprising a chemical vapour deposition chamber, means for holding a silicon substrate in said chamber, means for supporting a filament in said chamber, and means for supporting a carbon source in said chamber, said filament being supported between said substrate and said source in use, means for adjusting the spacing between said substrate and said source, and means for heating said substrate.

Preferably the apparatus further comprises means for electrically biasing said substrate holding means relative to said carbon source.

Although the theoretical basis of the invention is not necessary to it being worked, the applicants theorize that negative bias would accelerate ions to the substrate. The ion bombardment is a key factor for epitaxial growth. The applicants further theorize that the growth of beta-silicon carbide films involves the following steps. (1) Atomic hydrogen was formed by thermal decomposition of hydrogen by the hot filament (2) Hydrocarbon radicals ($C_xH_y$) were created by the reaction of atomic hydrogen with the graphite plate. (3) Atomic hydrogen reacts with the silicon substrate to form $SiH_x$ radicals. (4) The $C_xH_y$ radicals diffused to the substrate surface and adsorbed on the surface. (5) $C_xH_y$ radicals reacted with the $SiH_x$ radicals to form SiC film.

The apparatus according to the present invention consisted of an evacuable chamber, two feedthroughs for holding the filaments, two feedthroughs for holding the graphite plate, two feedthroughs for the thermocouple and the substrate heating, a solid graphite plate, and a moveable substrate holder. The substrate holder includes an electrically conductive path for substrate biasing and heating.

The apparatus also includes a controller for controlling the gas flow rate, a DC power supply for the filaments, another DC power supply for the biasing, another DC power supply for the resistive substrate heating, a pressure gauge for monitoring the pressure, and a thermocouple readout for reading the substrate temperature. As such, the processing parameters can be controlled in real time during the growth process.

BRIEF DESCRIPTION OF THE DRAWINGS

Some embodiments of the invention will now be described by way of example and with reference to the accompanying drawings, in which.

DETAILED DESCRIPTION OF THE PREFERRED EMBODIMENTS

Figure 1:
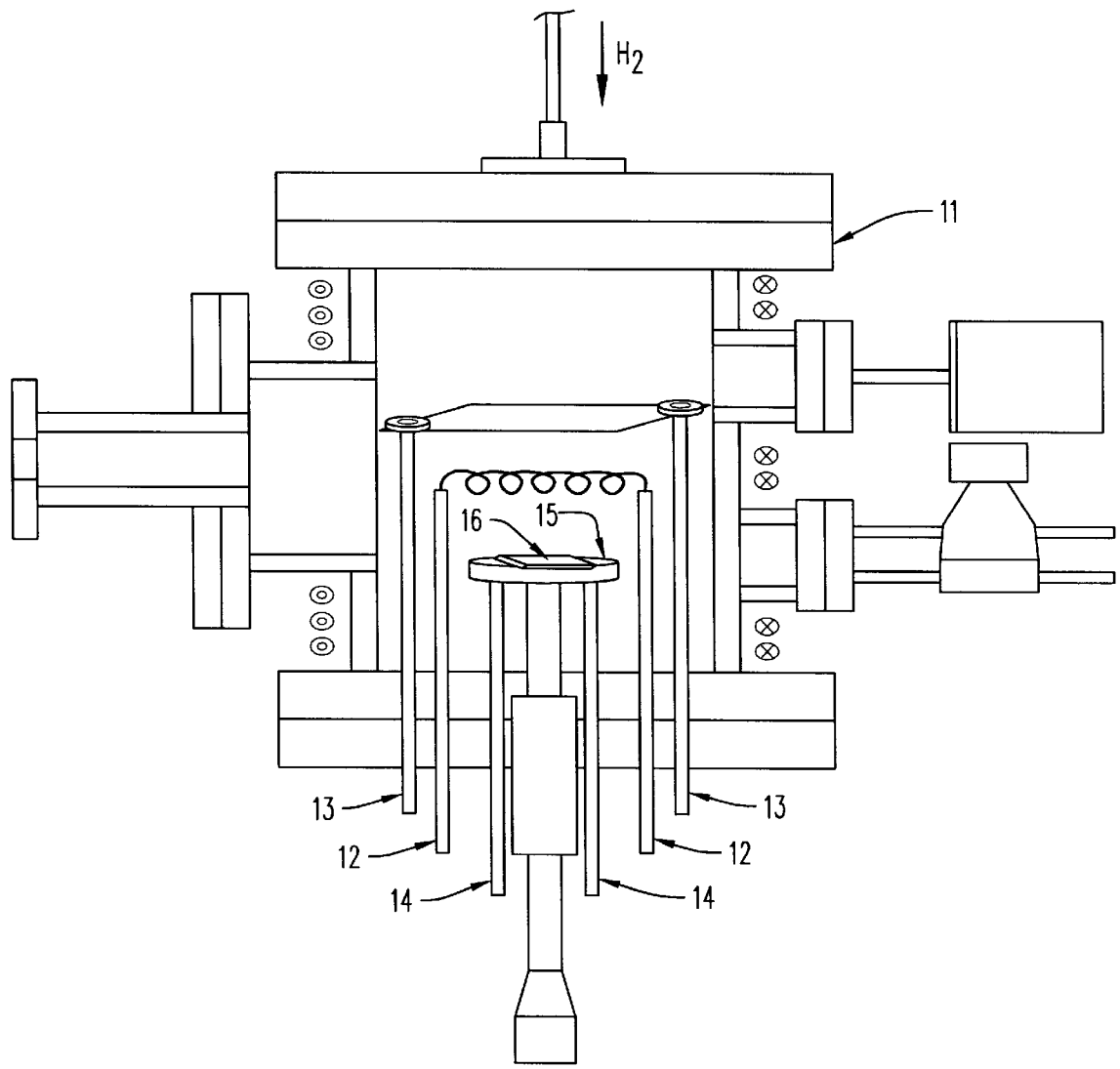
FIG. 1 is a schematic diagram of the apparatus according to an embodiment of the present invention.

A CVD reactor 10 according to an embodiment of the present invention is shown in FIG. 1. The CVD reactor 10, preferably includes a conventional CVD chamber 11, two feedthroughs 12 for holding a filament, two feedthroughs 13 for holding a graphite source, and two feedthroughs 14 for the electrical path for substrate biasing. The reactor 10 also contains a movable substrate holder 15 which can also be resistively heated by the electrical path in feedthrough 14. The position of substrate 16 relative to the filament may be varied between 0 (in contact with the filament) and 30 mm by moving the retractable substrate holder 15. The substrate holder 15 is connected to a controllable DC power supply in the illustrated embodiment to electrically bias the substrate holder with respect to the filament. Alternatively, the substrate holder 15 may be isolated from ground so that it is a floating electrical potential, or the substrate holder may be connected to ground.

EXAMPLE 1

The β-SiC film for this example was prepared in the apparatus as shown in FIG. 1. The substrate is a mirror-polished silicon wafer of (111) orientation. The distance between the graphite and the filaments was 3 mm and the distance between the filaments and the substrate was also 3 mm. The hydrogen flow rate was 100 SCCM. The pressure was 10 Torr. The filament temperature was 2200° C. The bias voltage was 400 V with an emission current of 50 mA. The substrate temperature was 1000° C. The growth time was 30 mins.

Figure 2:
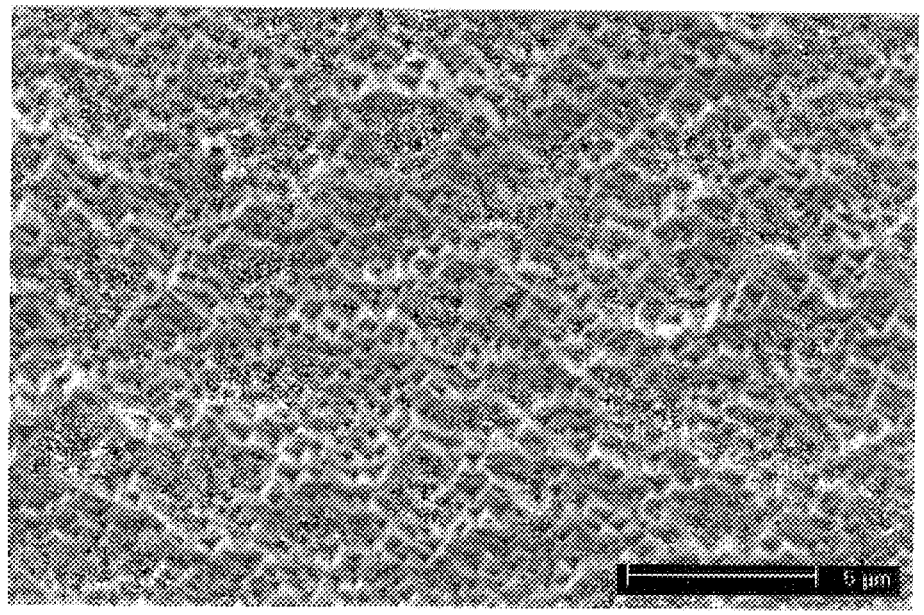
FIG. 2 is a scanning electron microscopy (SEM) micrograph of the β-SiC(111) film epitaxially grown on silicon (111) substrate, corresponding to example 1.
Figure 3A:
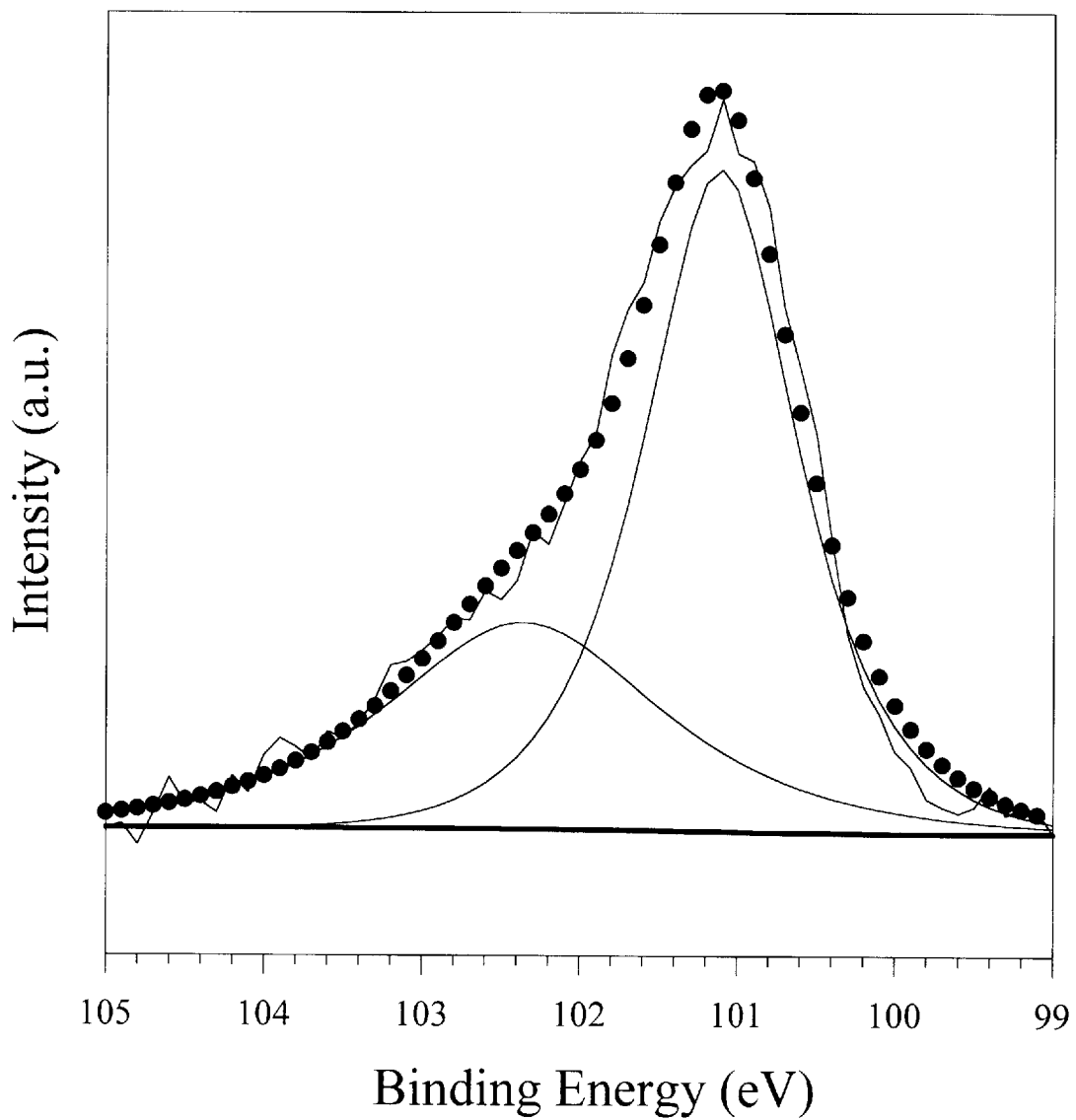
FIG. 3A is an Si 2p x-ray photoelectron spectroscopy (XPS) spectrum of the β-SiC(111) film shown in FIG. 2.
Figure 3B:
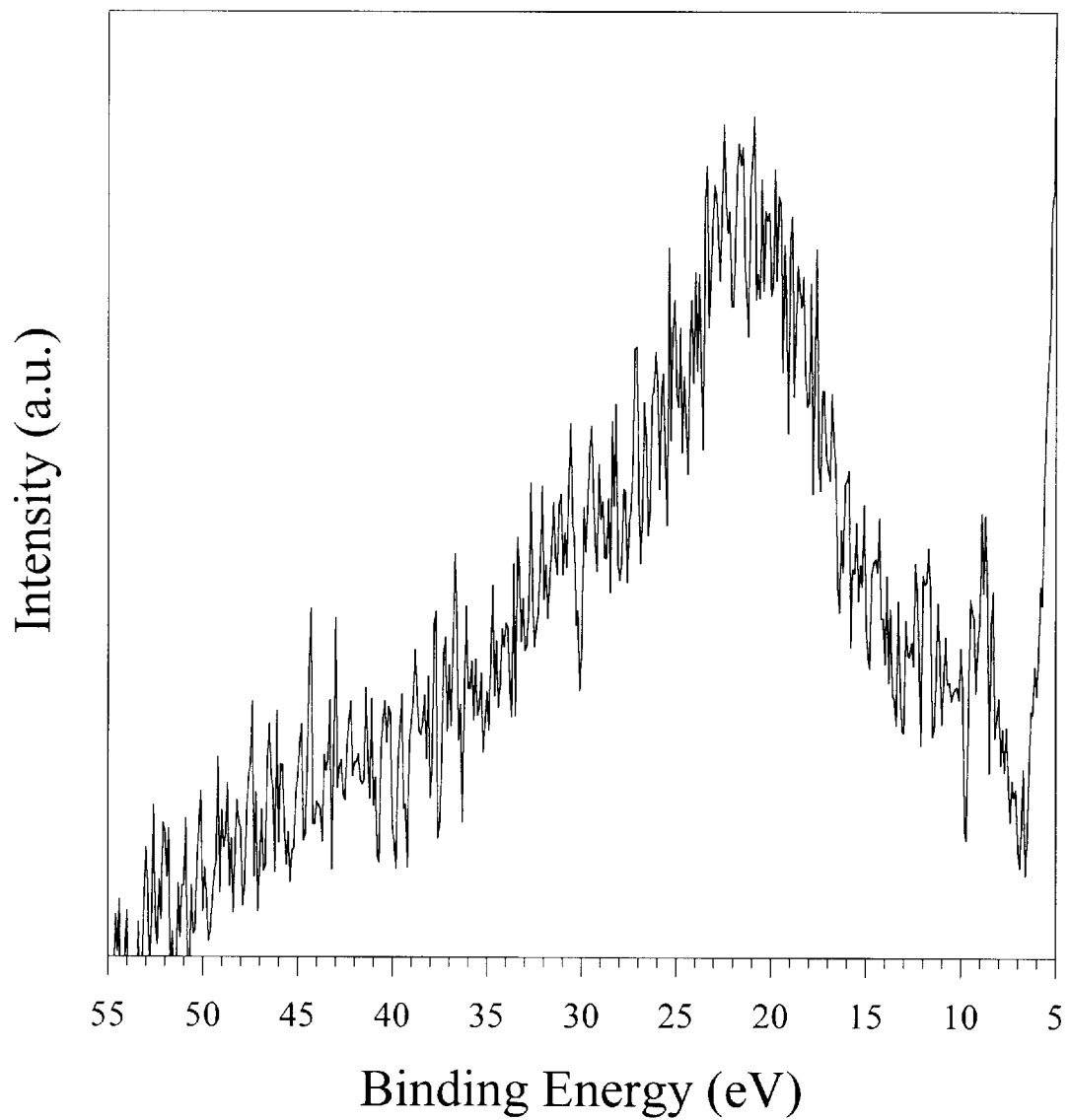
FIG. 3B is a C 1s XPS electron energy loss (EELS) spectrum of the β-SiC(111) film shown in FIG. 2.
Figure 4:
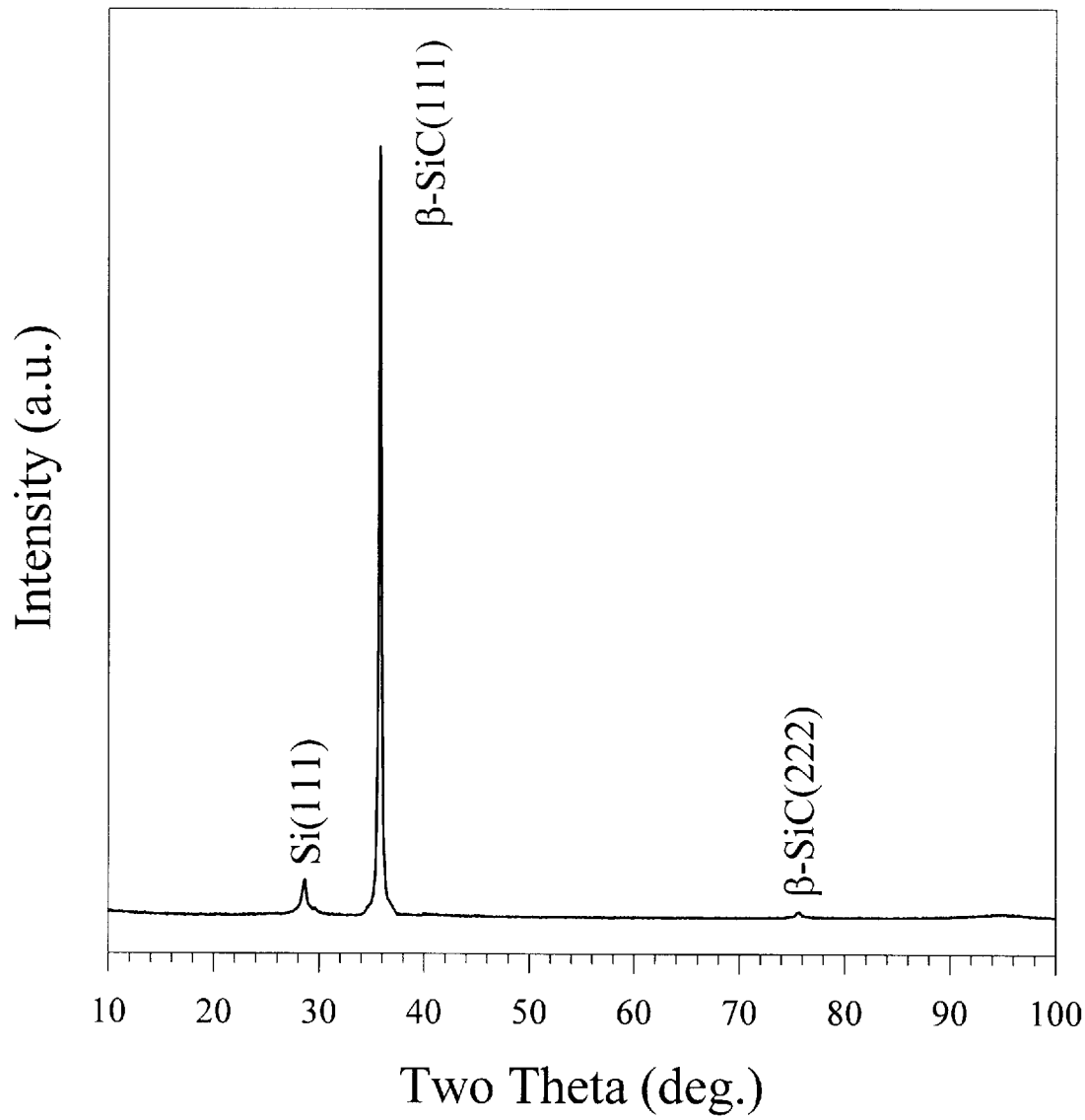
FIG. 4 is an x-ray diffraction (XRD) spectrum of the β-SiC(111) film shown in FIG. 2.
Figure 5:
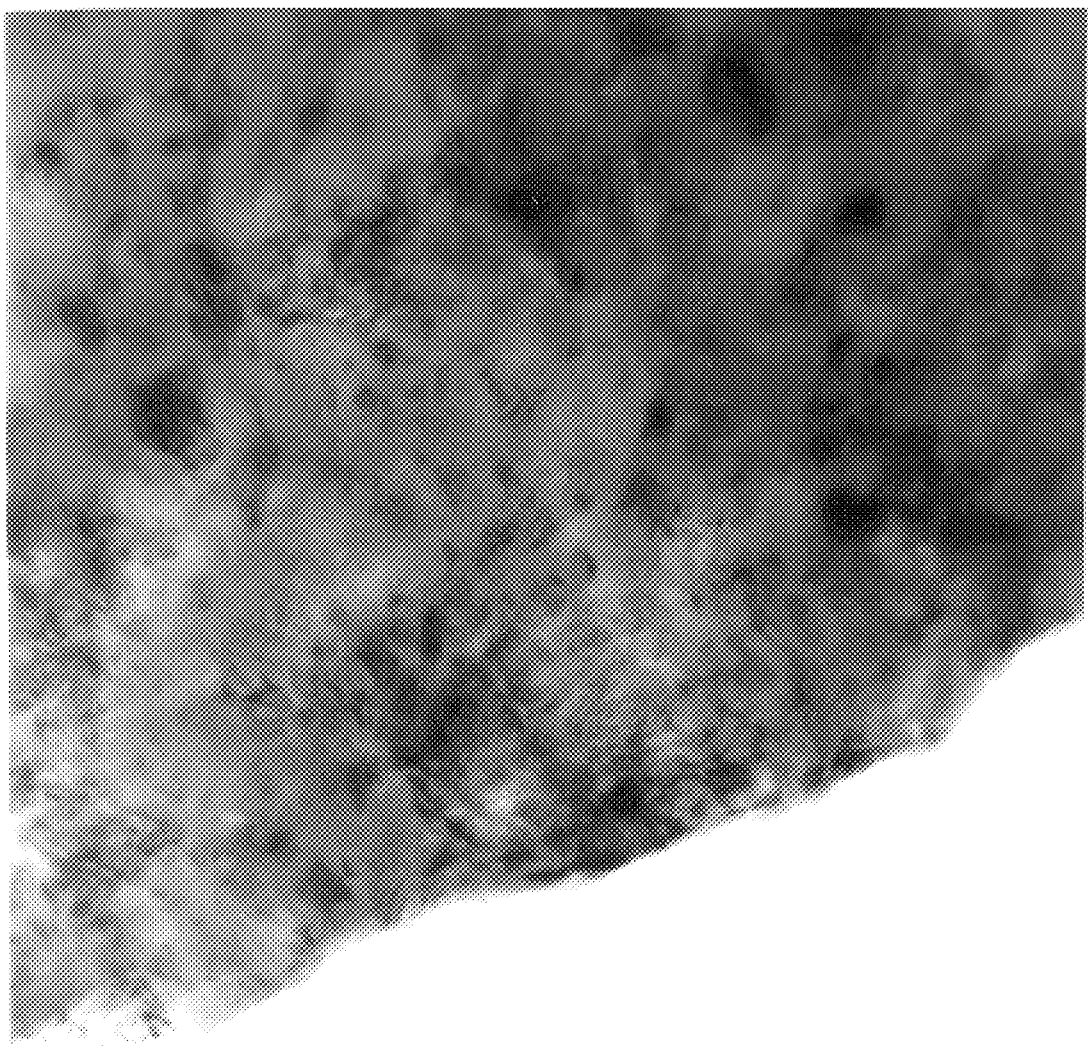
FIG. 5 is a plane view transmission electron microscopy (TEM) micrograph of the β-SiC(111) film shown in FIG. 2.
Figure 6:
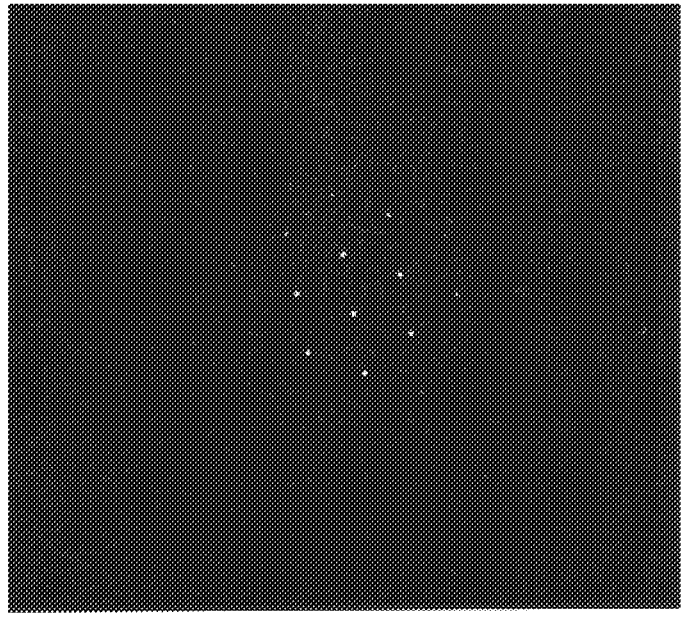
FIG. 6 is an selected area diffraction (SAD) pattern of the β-SiC(111) film shown in FIG. 5.

An SEM micrograph of the as grown film is shown in FIG. 2. The film consists of small grains with triangular crystal facets, which were the β-SiC(111) plane. It shows that all the grains are aligned in the same direction. X-ray photoelectron spectroscopy (XPS) was used to confirm the identity of the silicon carbide layer. A Si-2p XPS spectrum of the (111) β-SiC film is shown in FIG. 3A. The deconvoluted peaks at 101 eV and 102.5 eV were respectively assigned as the Si-C and Si-O bonding. A C 1s XPS electron energy loss spectrum (EELS) is shown in FIG. 3B. The loss peak at 23 eV is the standard loss peak of β-SiC. These XPS results confirm that the surface is β-SiC. In order to determine the film orientation, x-ray diffraction (XRD) was employed. An XRD spectrum of the film is shown in FIG. 4, where three peaks are visible, the β-SiC(111) peak has the highest intensity, while the weak β-SiC(222) is also distinctive. The small broad peak comes from the Si(111) substrate. The XRD results show that the β-SiC film has a strong texture in the <111> direction, which is the same as the silicon substrate. A TEM sample was prepared by etching out the silicon substrate in a mixture of hydrofluoric (HF) and nitric acid (HNO$_3$). The ratio was HF:HNO$_3$=1:3. As part of the film was thin enough to transmit the electron beam, no further sample thinning was required. A bright field plane view TEM image is shown in FIG. 5. The corresponding selected area diffraction (SAD) pattern is shown in FIG. 6. The SAD pattern suggests that highly textured (111) β-SiC film has been grown epitaxially on the (111) silicon substrate.

EXAMPLE 2

In this example, a processing apparatus similar to that shown in FIG. 1 was used to deposit β-SiC film. The substrate was also a mirror-polished silicon (111) wafer. All the deposition parameters were similar to example 1 except that no bias voltage was applied to the substrate during the growth period. The substrate was resistively heated by passing a DC current to the substrate holder in order to attain the desired substrate temperature of 1000° C., which is the same as that in example 1.

Figure 7:
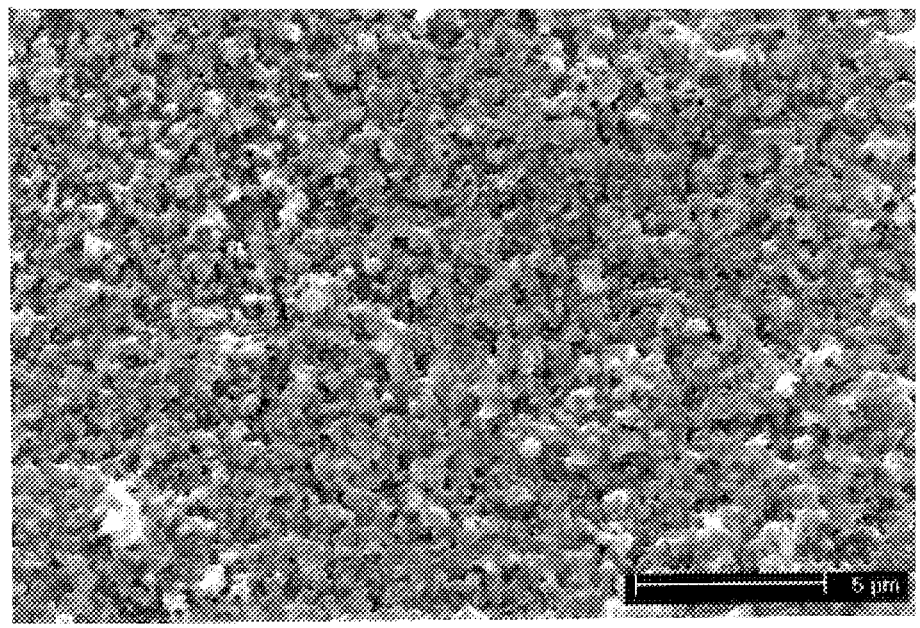
FIG. 7 is an SEM micrograph of the polycrystalline β-SiC film grown on silicon (111) substrate, corresponding to example 2.
Figure 8A:
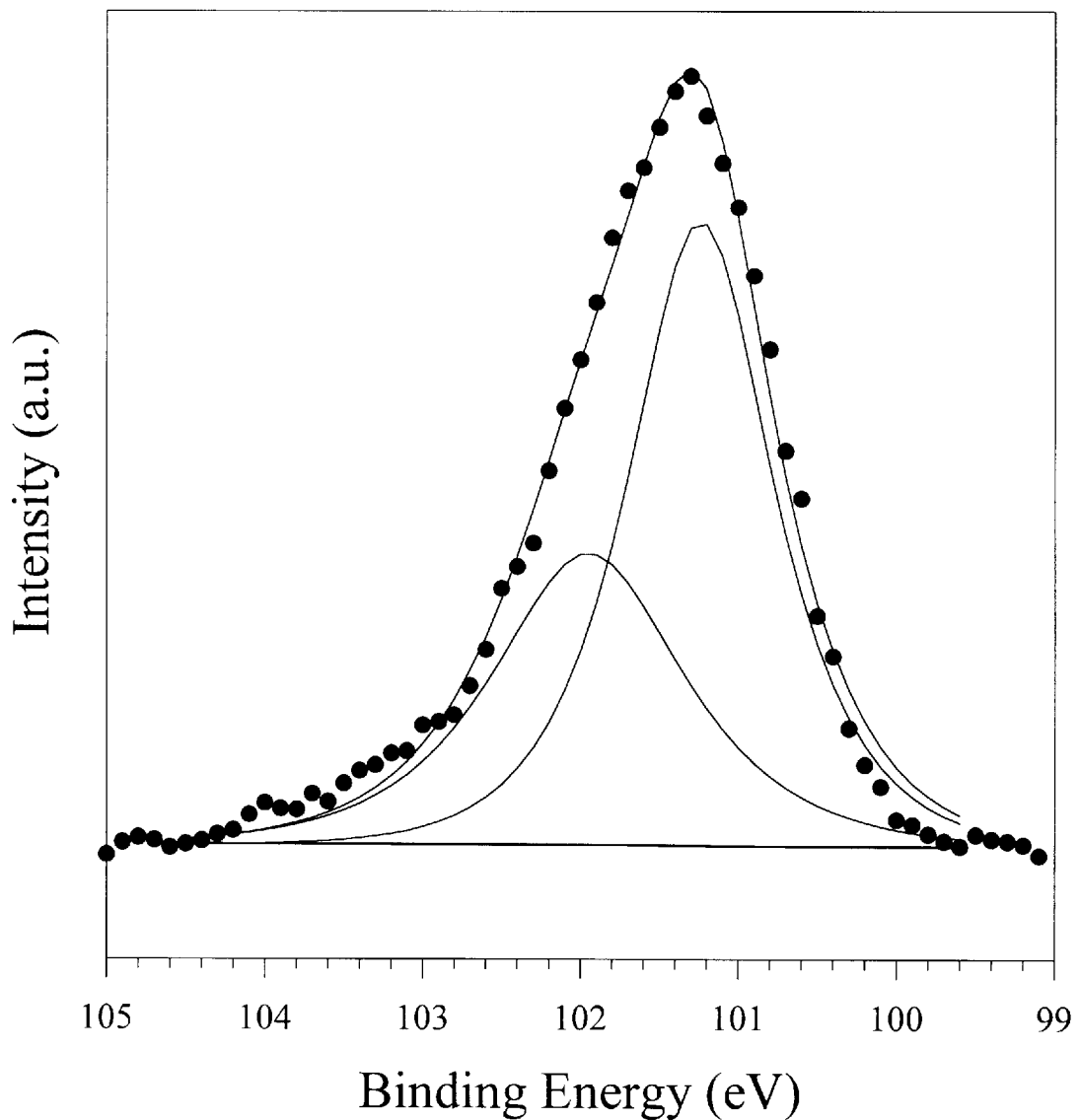
FIG. 8A is an Si 2p XPS spectrum of the polycrystalline β-SiC film shown in FIG. 7.
Figure 8B:
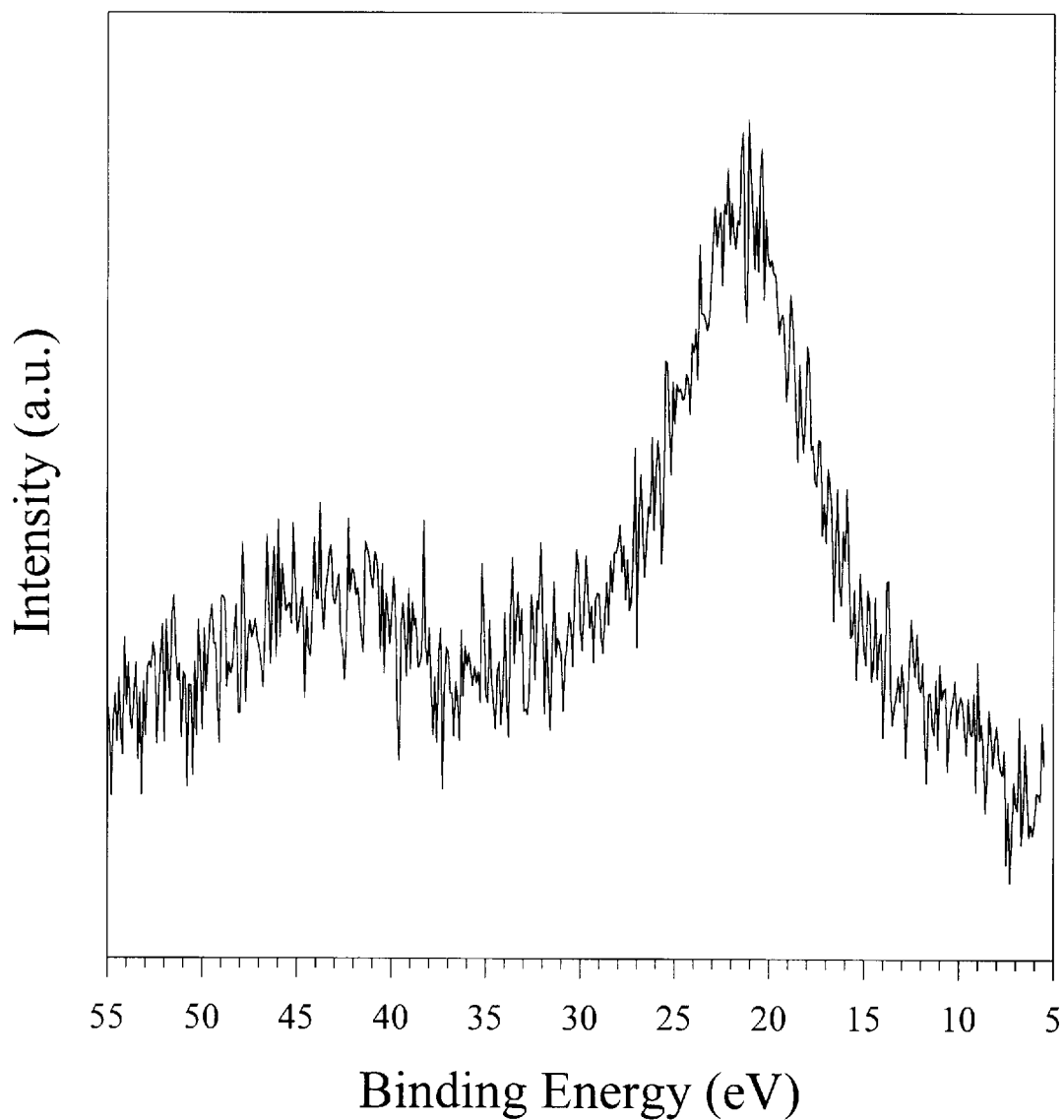
FIG. 8B is a C 1s XPS EELS spectrum of the polycrystalline β-SiC film shown in FIG. 7.
Figure 9:
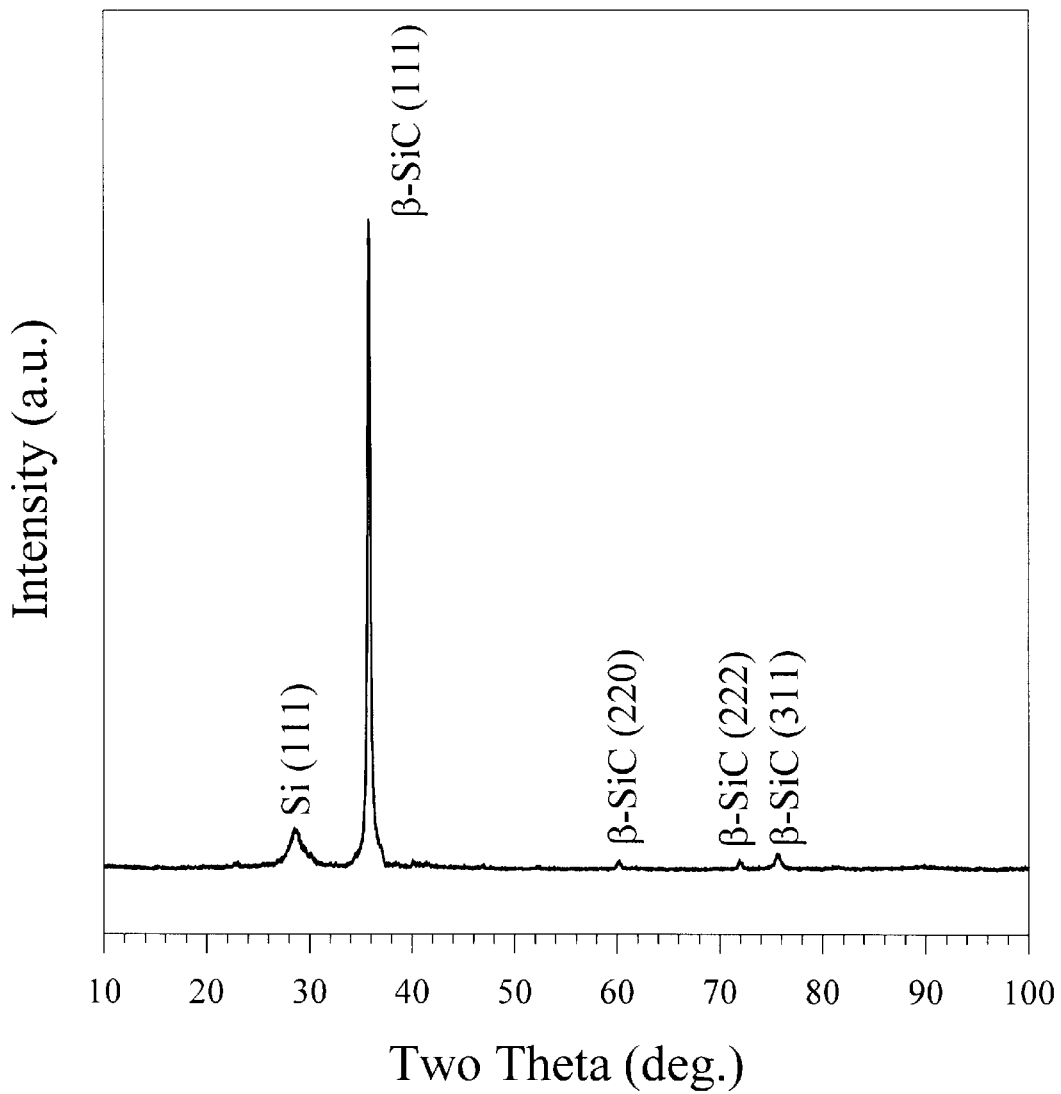
FIG. 9 is an XRD spectrum of the polycrystalline β-SiC film shown in FIG. 7.
Figure 10:
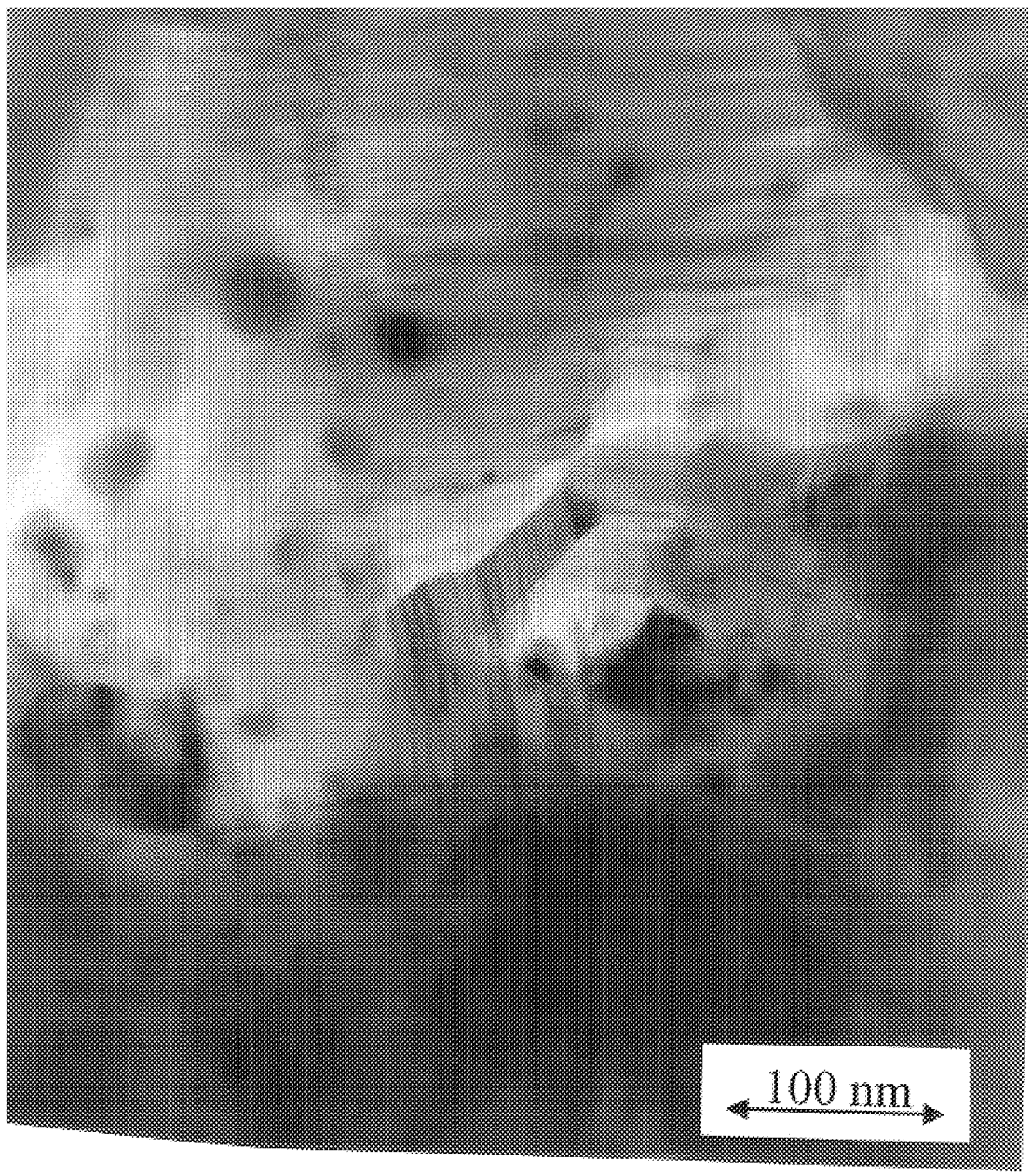
FIG. 10 is a plane view TEM micrograph of the polycrystalline β-SiC film shown in FIG. 7.
Figure 11:
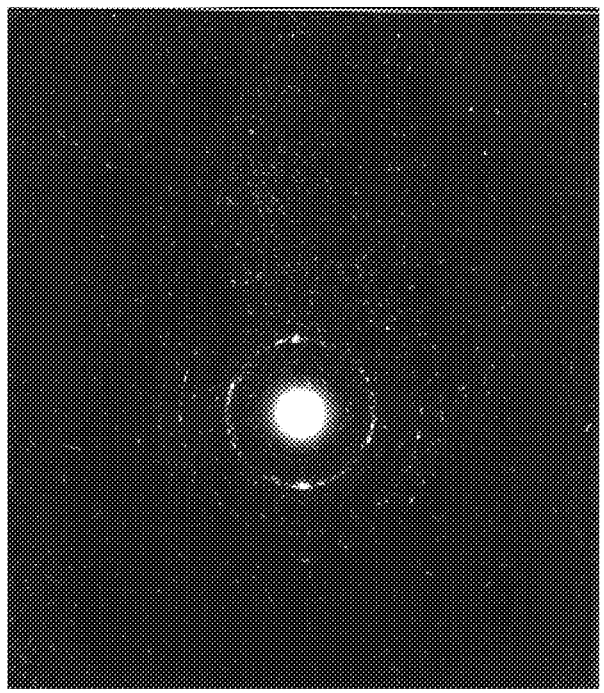
FIG. 11 is an SAD pattern of the polycrystalline β-SiC film shown in FIG. 10.

An SEM micrograph of the film is shown in FIG. 7. Based on the SEM observation, the film is polycrystalline in structure. Si 2p XPS and C1s XPS EELS spectra are shown in FIGS. 8A and 8B, respectively. Both XPS spectra are similar to those in example 1 (FIGS. 3A & 3B). This demonstrates that the film is β-SiC. The corresponding XRD spectrum is shown in FIG. 9. Besides the β-SiC(111) and (222) peaks, the (220) and (311) peaks can also be observed. This shows that the film is polycrystalline in nature. However, based on the relative intensity ratio of the (111) peak to other peaks, the film still got a preferred orientation along the <111> direction. TEM samples were prepared in the same way as that used in example 1. The corresponding bright field plan view image is shown in FIG. 10. The SAD pattern is shown in FIG. 11. The SAD pattern shows circular rings rather than diffraction spots, which shows that the films is polycrystalline. This example, together with example 1, demonstrates that negative substrate bias is important in controlling the film orientation, but is not strictly essential.

EXAMPLE 3

The β-SiC film for this example was prepared in the apparatus as shown in FIG. 1. The substrate is a mirror-polished silicon wafer of (100) orientation. The distance between the graphite plate and the filaments was 3 mm and the distance between the filaments and the substrate was 2 mm. The hydrogen flow rate was 100 SCCM. The pressure was 5 Torr. The filaments temperature was 2200° C. No bias voltage was applied and the substrate temperature was 1100° C. The growth time was 30 minutes.

Figure 12:
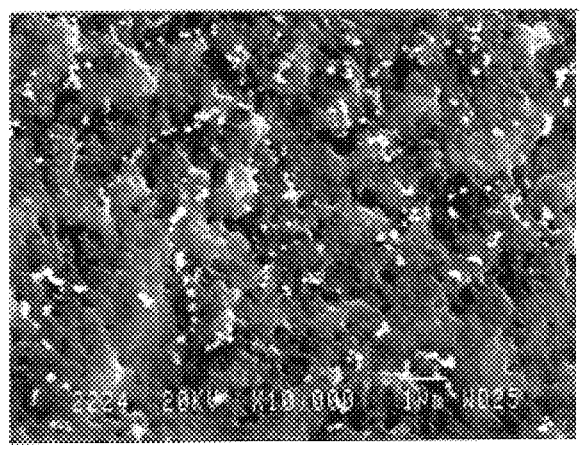
FIG. 12 is an SEM micrograph of the polycrystalline β-SiC film grown on silicon (100) substrate, corresponding to example 3.
Figure 13:
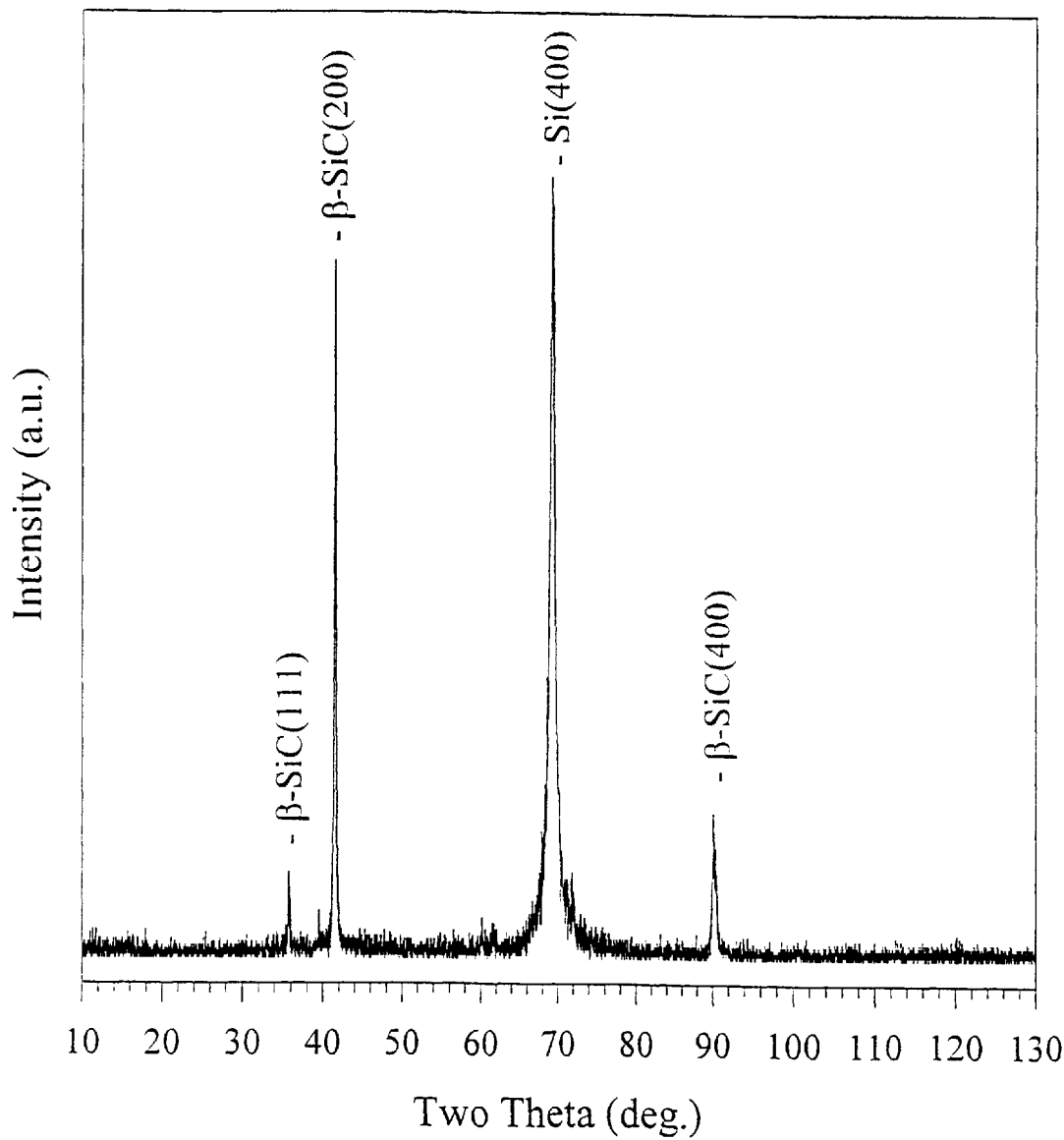
FIG. 13 is an XRD spectrum of the polycrystalline β-SiC film shown in FIG. 12.
Figure 14:
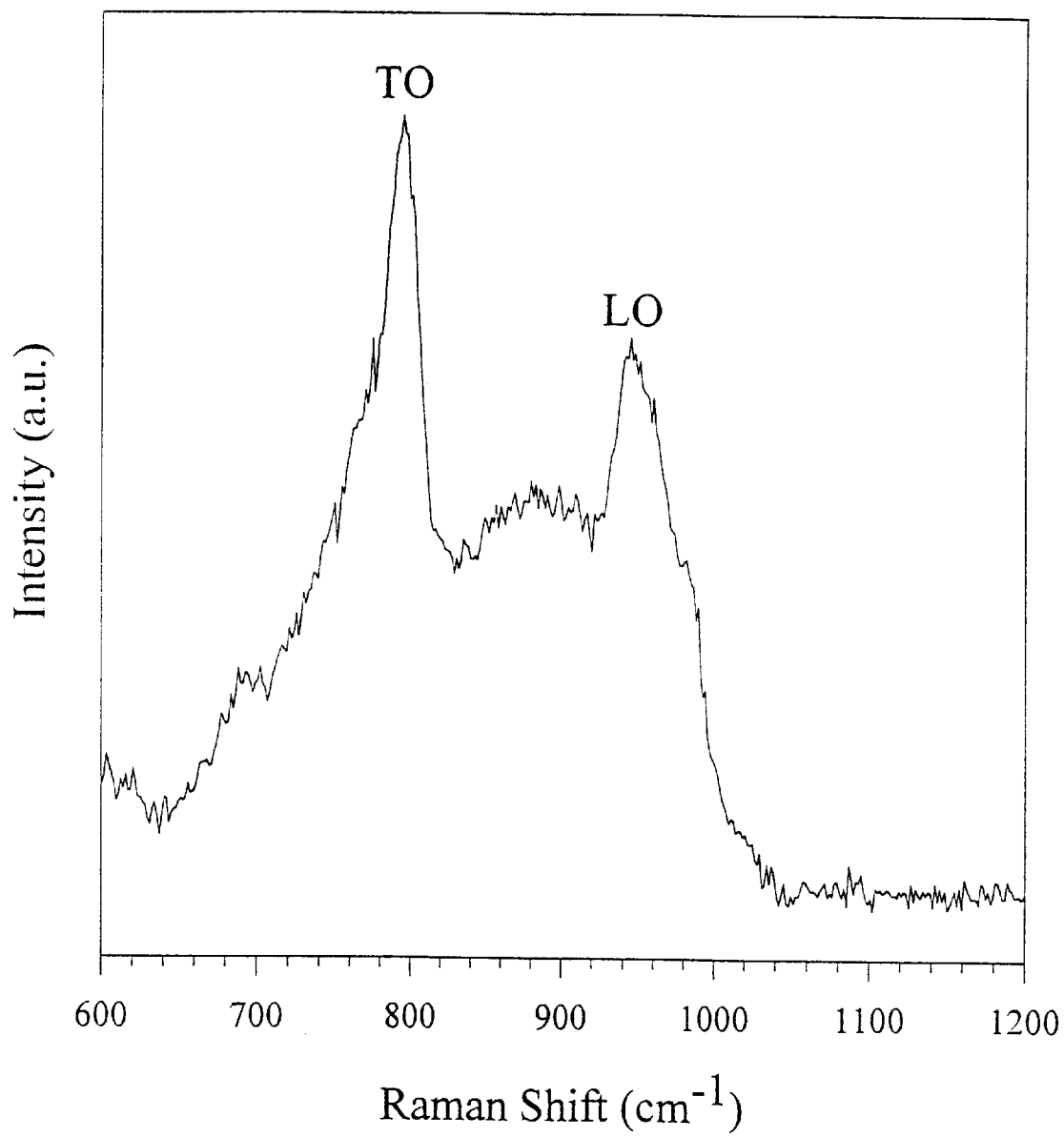
FIG. 14 is a Raman spectrum of the polycrystalline β-SiC film shown in FIG. 12.

An SEM micrograph of the as grown film is shown in FIG. 12. An XRD spectrum of the film is shown in FIG. 13, where four peaks are visible. These peaks are the (111), (200) and (400) peaks of β-SiC and the Si(400) peak from the substrate. The XRD results show that a polycrystalline β-SiC film with a (100) preferred orientation was deposited. The identity of the film is further confirmed by the Raman spectrum as shown in FIG. 14. The two peaks at 796 and 970 $cm^{-1}$ correspond respectively to the Transverse Optical (TO) and the Longitudinal Optical (LO) phonon peaks of β-SiC.

EXAMPLE 4

The β-SiC film for this example was prepared in the apparatus as shown in FIG. 1. The substrate is a mirror-polished silicon wafer of (100) orientation. The distance between the graphite plate and the filaments was 2 mm and the distance between the filaments and the substrate was 1 mm. The hydrogen flow rate was 100 SCCM. The pressure was 10 Torr. The filaments temperature was 2200° C. No bias voltage was applied and the substrate temperature was 1200° C. The growth time was 30 minutes.

Figure 15:
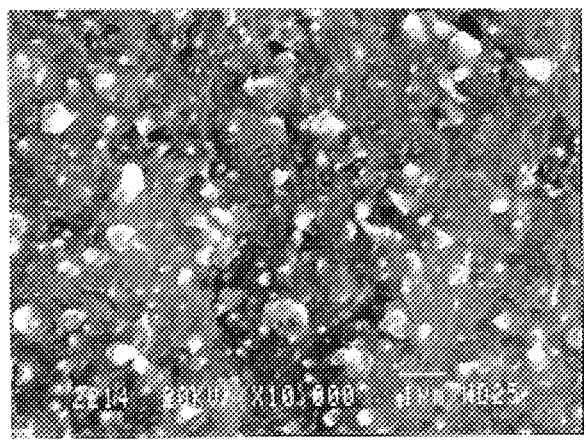
FIG. 15 is an SEM micrograph of the polycrystalline β-SiC film grown on silicon (100) substrate, corresponding to example 4.
Figure 16:
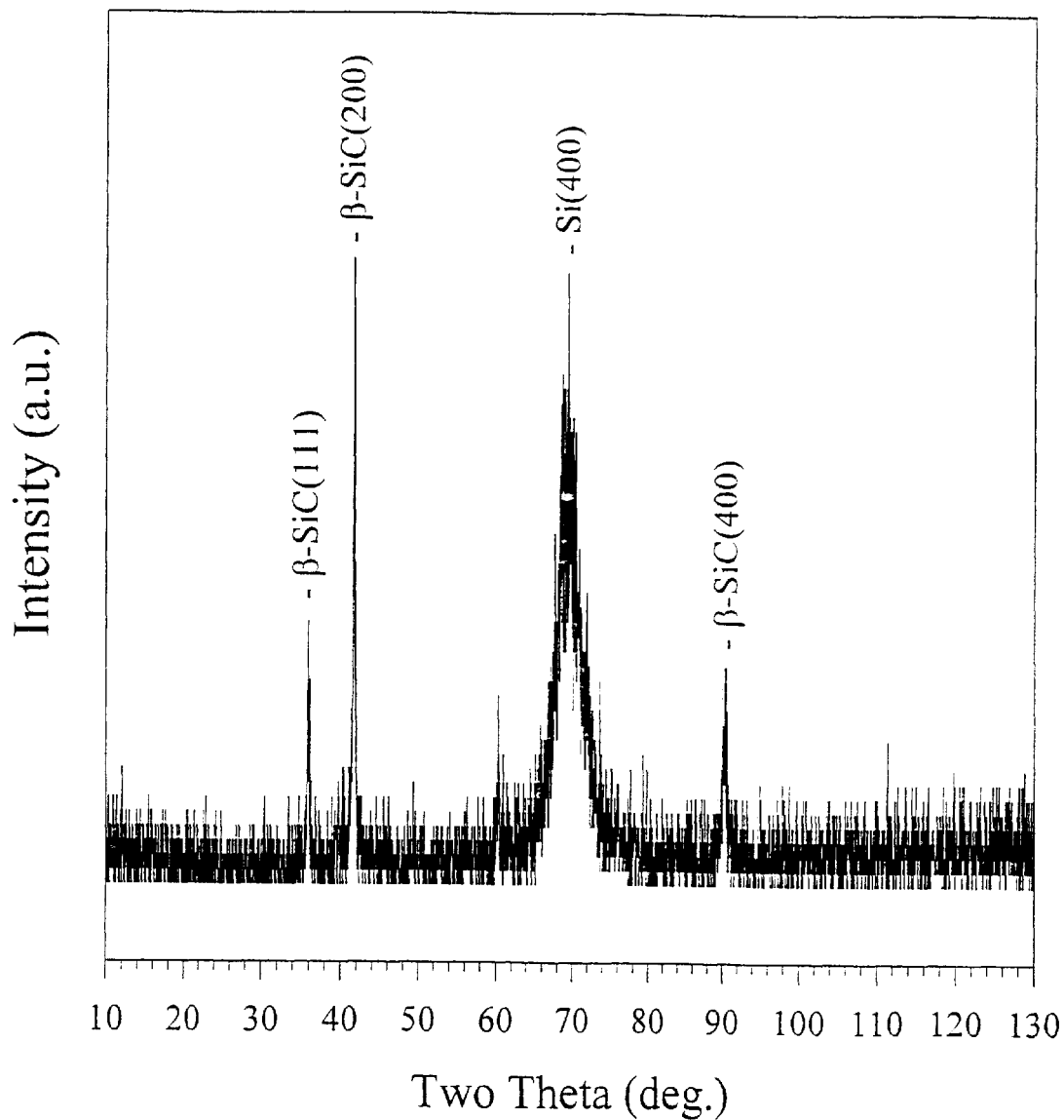
FIG. 16 is an XRD spectrum of the polycrystalline β-SiC film shown in FIG. 15.
Figure 17:
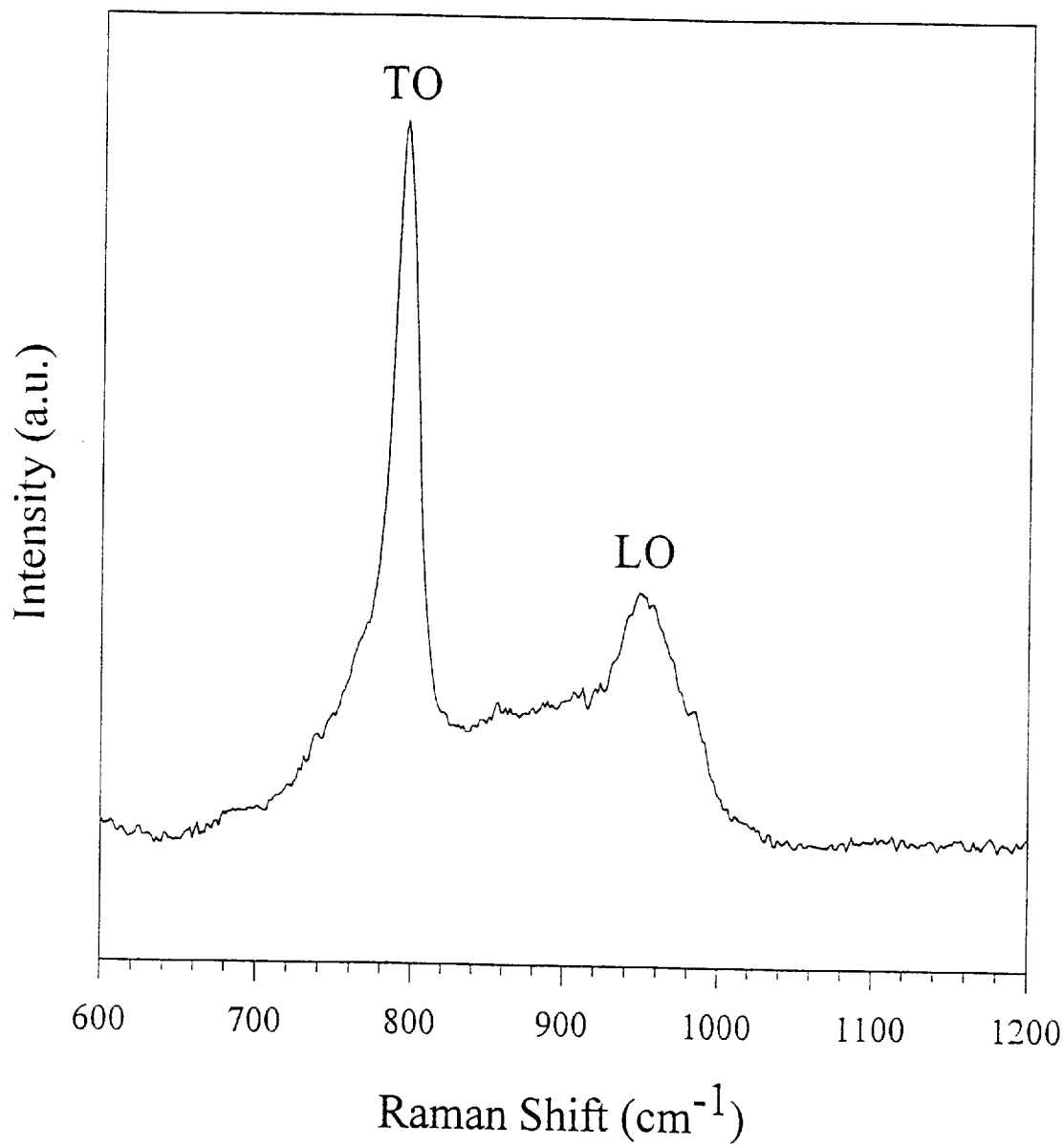
FIG. 17 is a Raman spectrum of the polycrystalline β-SiC film shown in FIG. 15.

An SEM micrograph of the as grown film is shown in FIG. 15. The film consists of small grains of about 0.1 to 1 μm diameter. An XRD spectrum of the film is shown in FIG. 16 where four peaks are visible. These peaks are the (111), (200) and (400) peaks of the β-SiC and the Si(400) peak from the substrate. The XRD results show that a polycrystalline β-SiC film with a (100) preferred orientation was deposited. The identity of the film is further confirmed by the Raman spectrum as shown in FIG. 17. The two peaks at 796 and 970 $cm^{-1}$ correspond respectively to the TO and LO phonon peaks of β-SiC.

EXAMPLE 5

The β-SiC film for this example was prepared in the apparatus as shown in FIG. 1. The substrate is a mirror-polished silicon wafer of (100) orientation. The distance between the graphite plate and the filaments was 3 mm and the distance between the filaments and the substrate was 2 mm. The hydrogen flow rate was 100 SCCM. The pressure was 1 Torr. The filament temperature was 2200° C. No bias voltage was applied and the substrate temperature was 1000° C. The growth time was 30 minutes.

Figure 18:
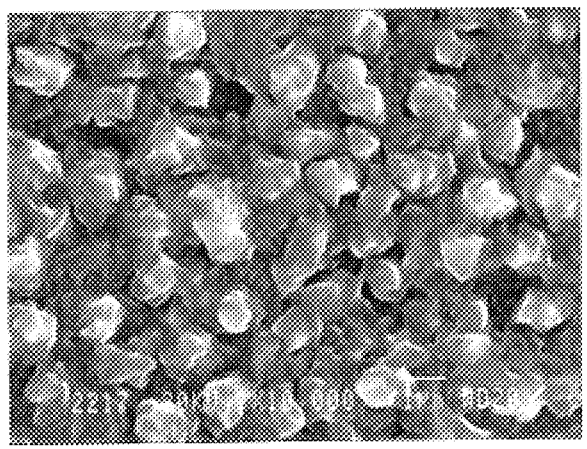
FIG. 18 is an SEM micrograph of the polycrystalline β-SiC film grown on silicon (100) substrate, corresponding to example 5.
Figure 19:
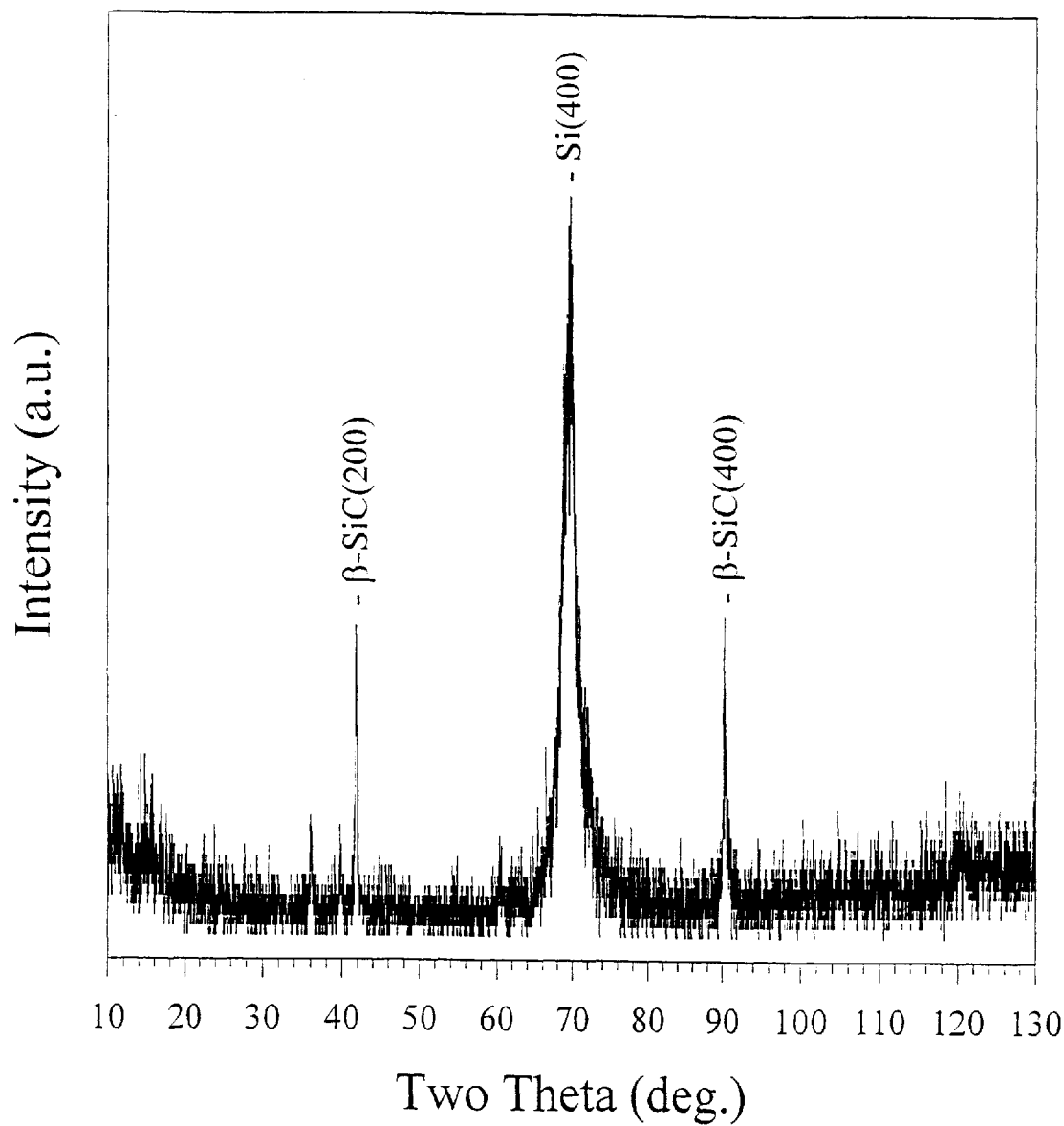
FIG. 19 is an XRD spectrum of the polycrystalline β-SiC film shown in FIG. 18.
Figure 20:
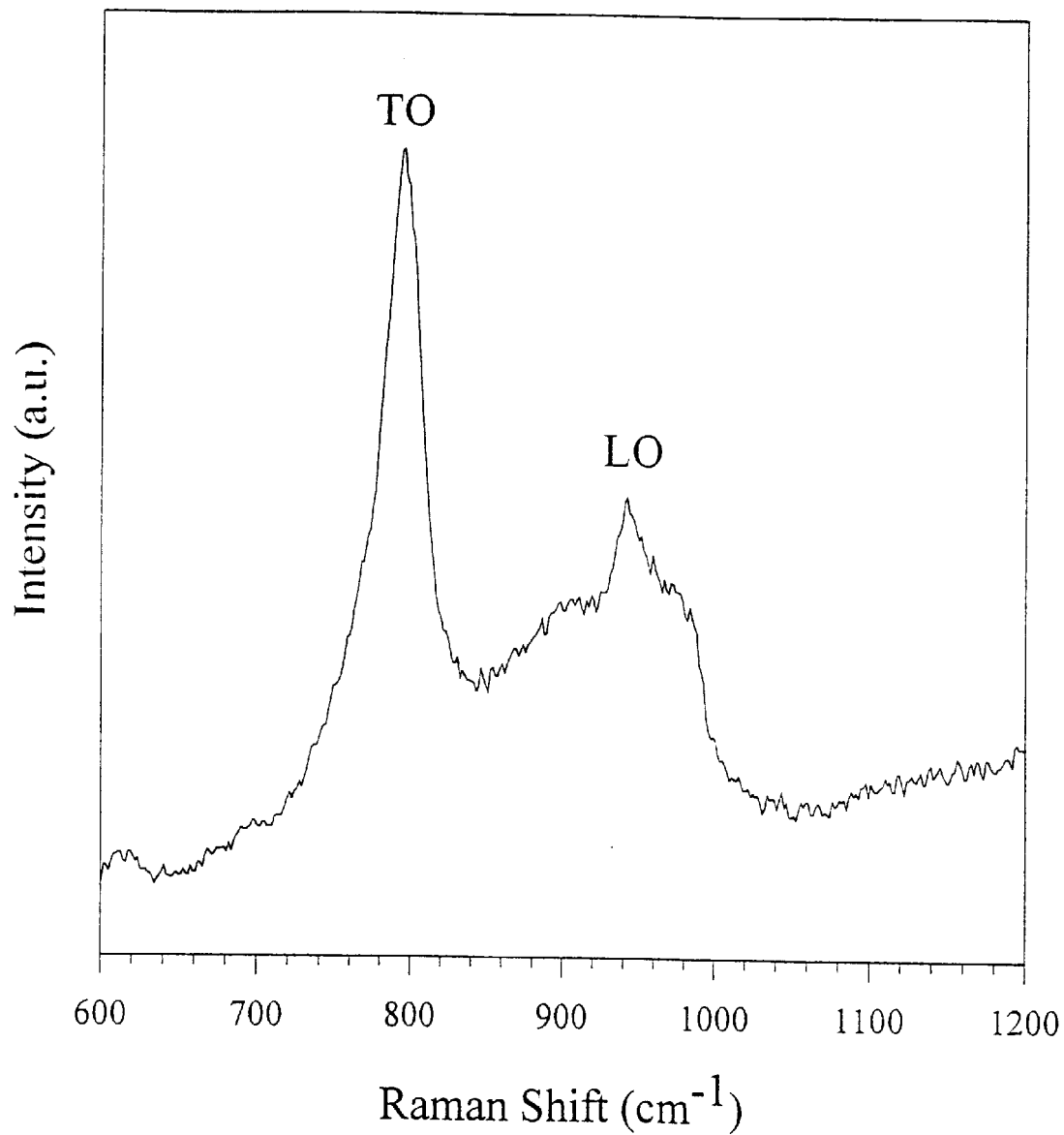
FIG. 20 is a Raman spectrum of the polycrystalline β-SiC film shown in FIG. 18.

An SEM micrograph of the as grown film is shown in FIG. 18. The film consists of β-SiC crystals of about 1 μm in diameter. An XRD spectrum of the film is shown in FIG. 19 where only three peaks are visible. These peaks are the (200) and (400) peaks of β-SiC and the Si(400) peak from the substrate. The XRD results show that under the stated deposition conditions, the growth of (111) oriented β-SiC crystals is suppressed. The β-SiC film so obtained has a (100) preferred orientation. The identity of the film is further confirmed by the Raman spectrum as shown in FIG. 20. The two peaks at 796 and 970 $cm^{-1}$ correspond respectively to the TO and LO phonon peaks of β-SiC.

EXAMPLE 6

The β-SiC film for this example was prepared in the apparatus as shown in FIG. 1. The substrate is a mirror-polished silicon wafer of (100) orientation. The distance between the graphite plate and the filaments was 2 mm and the distance between the filaments and the substrate was also 2 mm. The hydrogen flow rate was 100 SCCM. The pressure was 50 Torr. The filament temperature was 2200° C. No bias voltage was applied and the substrate temperature was 1100° C. The growth time was 45 minutes.

Figure 21:
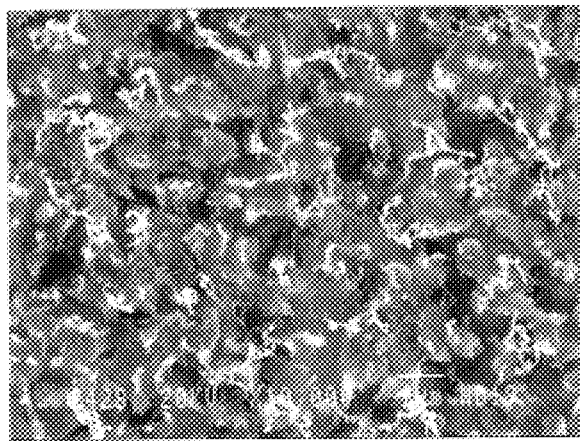
FIG. 21 is an SEM micrograph of the polycrystalline β-SiC film grown on silicon (100) substrate, corresponding to example 6.
Figure 22:
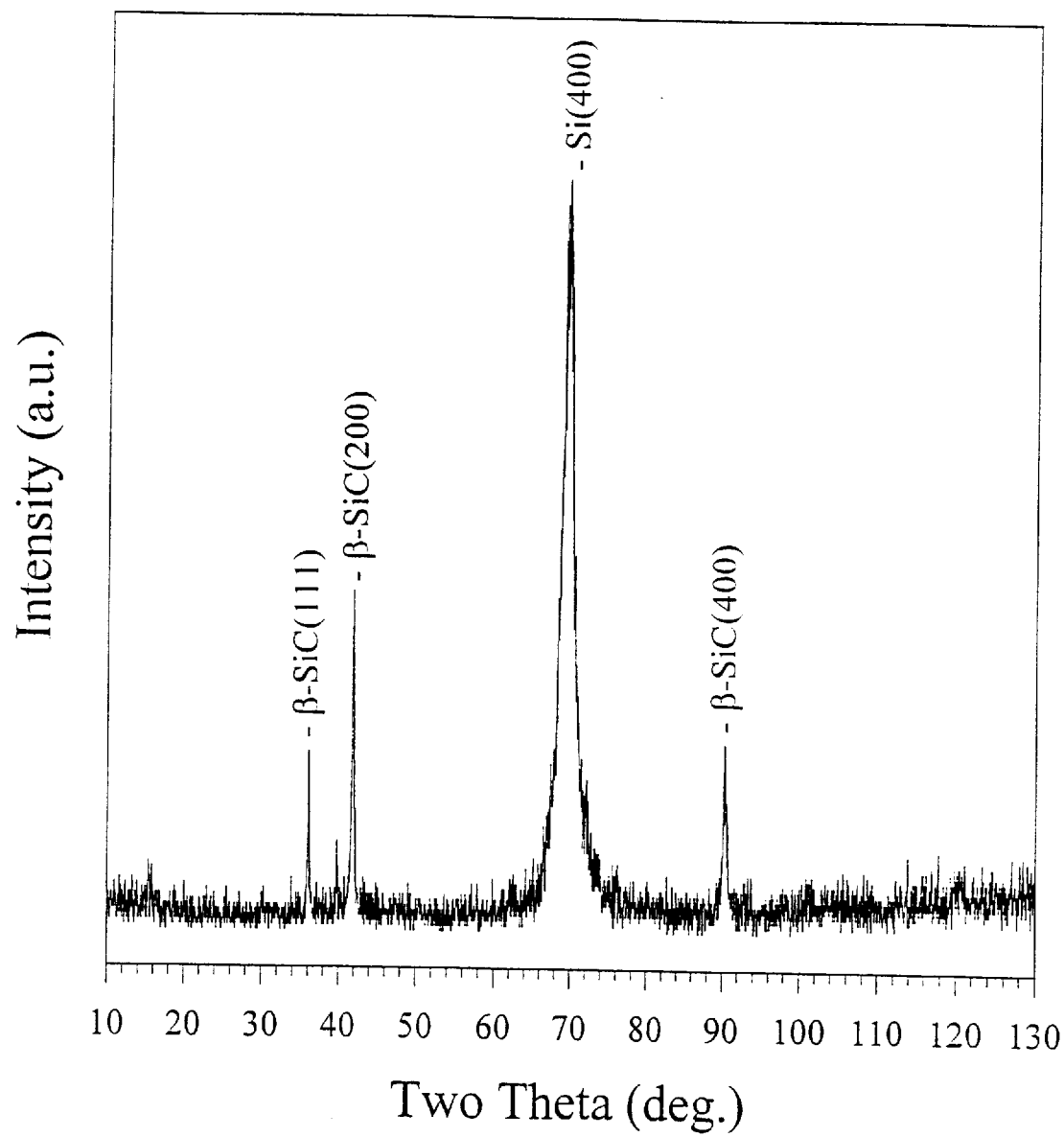
FIG. 22 is an XRD spectrum of the polycrystalline β-SiC film shown in FIG. 21.
Figure 23:
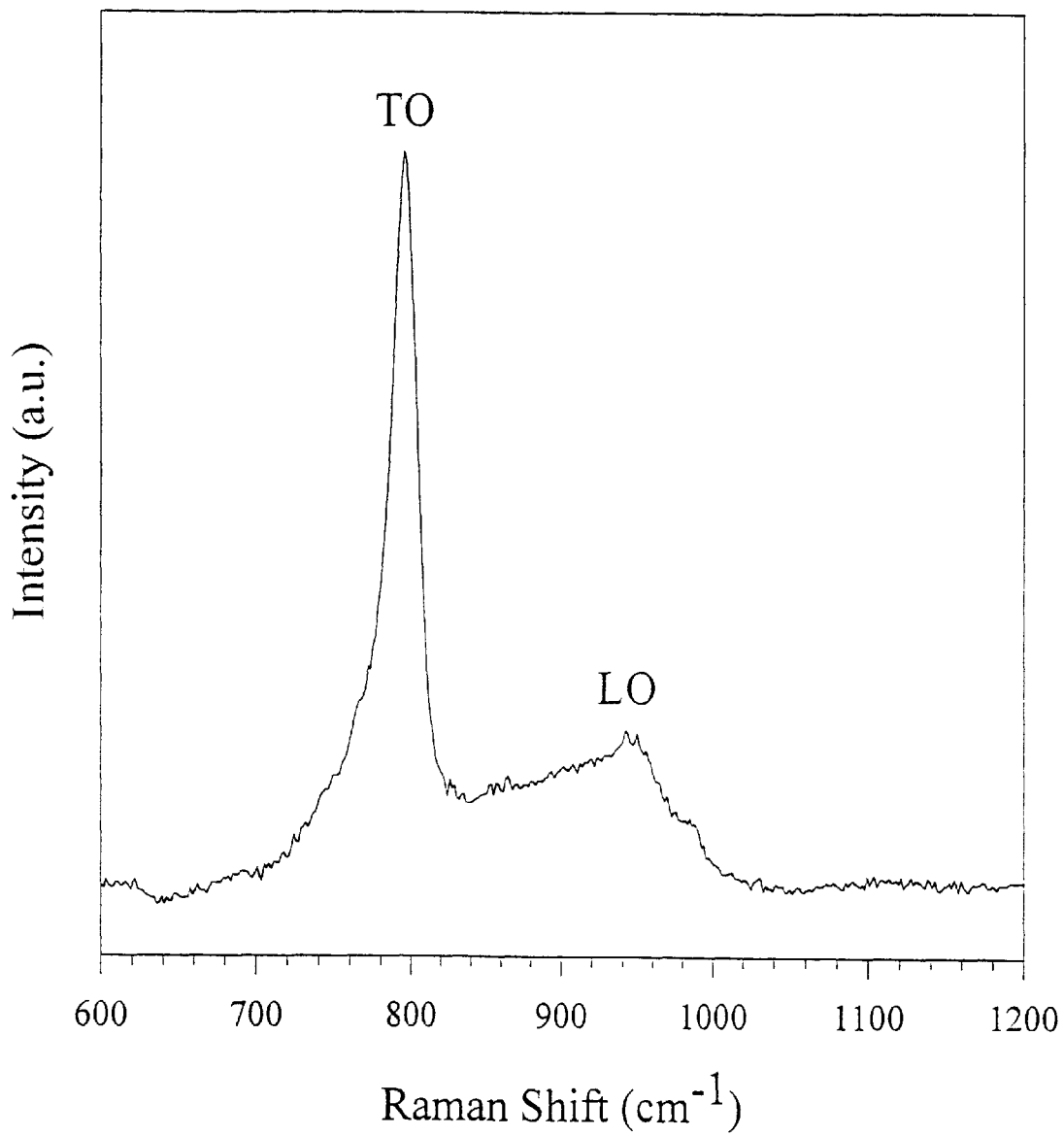
FIG. 23 is a Raman spectrum of the polycrystalline β-SiC film shown in FIG. 21.

An SEM micrograph of the as grown film is shown in FIG. 21. An XRD spectrum of the film is shown in FIG. 22 where four peaks are visible. These peaks are the (111), (200) and (400) peaks of the β-SiC and the Si(400) peak from the substrate. The identity of the film is further confirmed by the Raman spectrum as shown in FIG. 23. The two peaks at 796 and 970 $cm^{-1}$ correspond respectively to the TO and LO phonon peaks of β-SiC.

EXAMPLE 7

The β-SiC film for this example was prepared in the apparatus as shown in FIG. 1. The substrate is a mirror-polished silicon wafer of (100) orientation. The distance between the graphite plate and the filaments was 2 mm and the distance between the filaments and the substrate was also 2 mm. The hydrogen flow rate was 100 SCCM. The pressure was 100 Torr. The filament temperature was 2200° C. No bias voltage was applied and the substrate temperature was 850° C. The growth time was 10 minutes.

Figure 24:
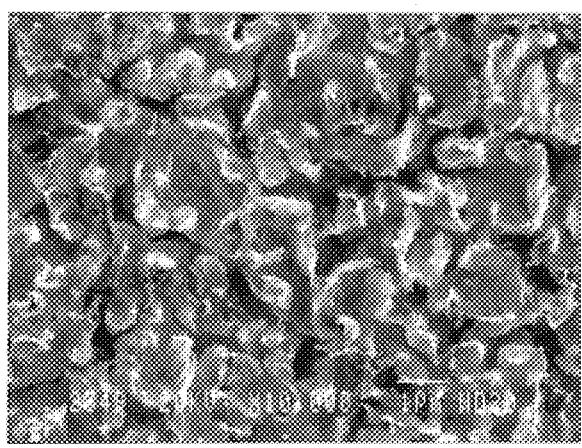
FIG. 24 is an SEM micrograph of the polycrystalline β-SiC film grown on silicon (100) substrate, corresponding to example 7.
Figure 25:
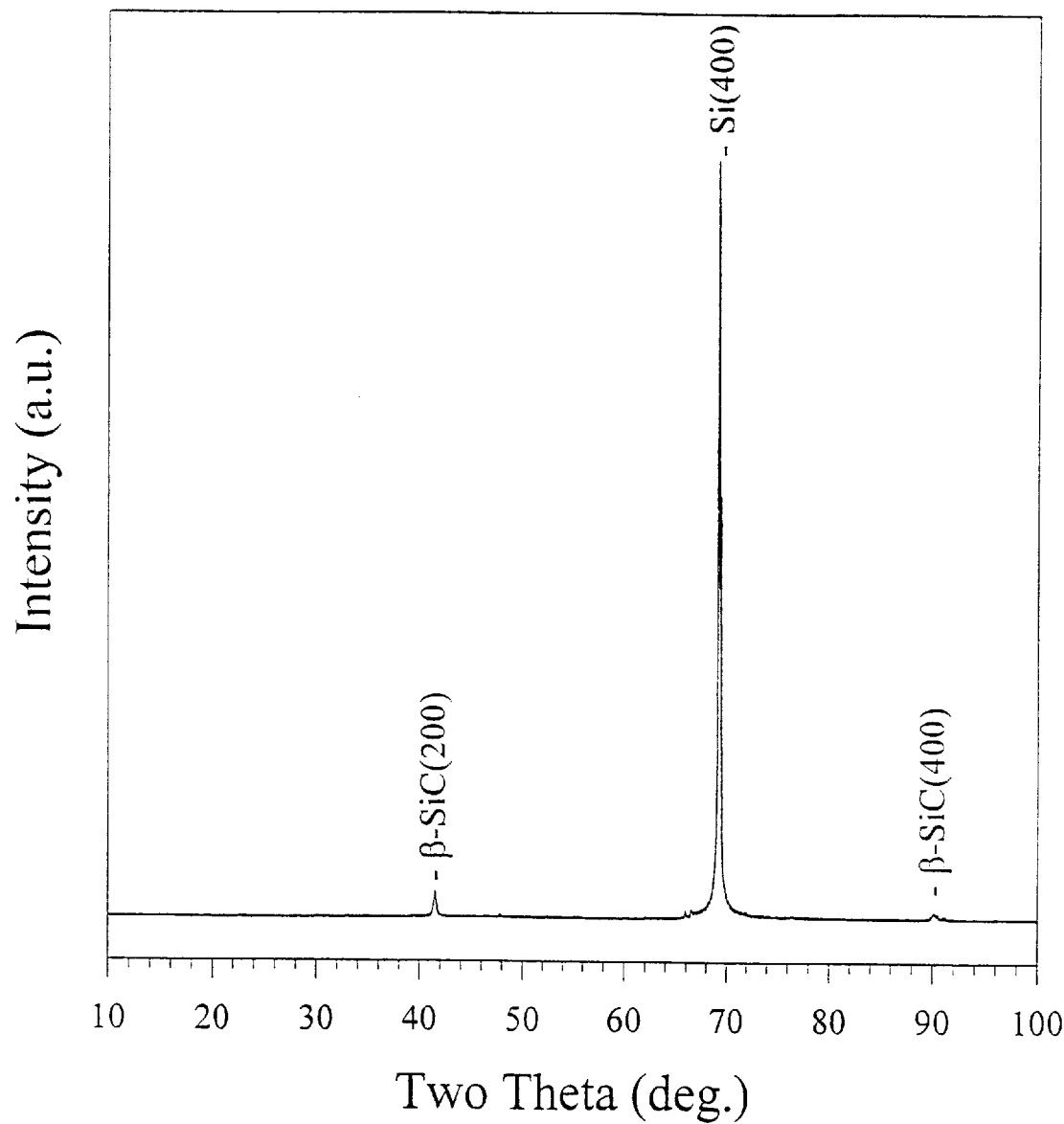
FIG. 25 is an XRD spectrum of the polycrystalline β-SiC film shown in FIG. 24.
Figure 26:
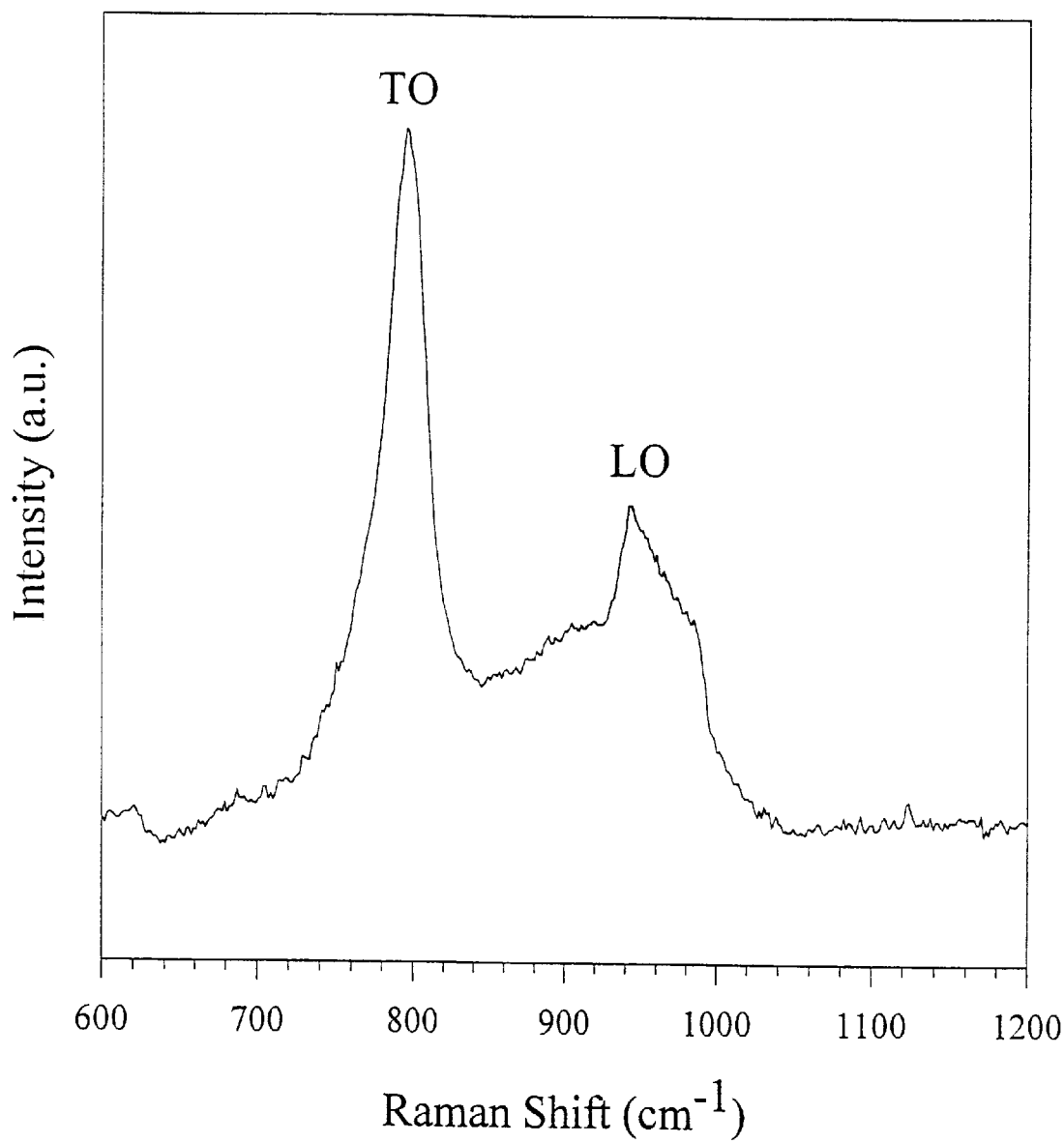
FIG. 26 is a Raman spectrum of the polycrystalline β-SiC film shown in FIG. 24.

An SEM micrograph of the as grown film is shown in FIG. 24. An XRD spectrum of the film is shown in FIG. 25 where only three peaks are visible. These peaks are the (200) and (400) peaks of β-SiC and the Si(400) peak from the substrate. The identity of the film is further confirmed by the Raman spectrum as shown in FIG. 26. The two peaks at 796 and 970 $cm^{-1}$ correspond respectively to the TO and LO phonon peaks of β-SiC.

We claim:

1. A method for the growth of a beta-silicon carbide film on a silicon substrate by chemical vapour deposition, comprising the steps of using solid carbon as the carbon source and using solid silicon as the silicon source, and using $H_2$ as the reactant gas and a hot filament as a means of gaseous activation.

2. A method as claimed in claim 1 wherein the silicon substrate is used as the silicon source.

3. A method as claimed in claim 1 wherein the spacing between said silicon substrate and said graphite source is adjustable.

4. A method as claimed in claim 1 further comprising heating said silicon substrate in order to obtain the desired temperature for silicon carbide growth on silicon.

5. A method as claimed in claim 1 wherein said silicon substrate is supported on a substrate holder and said substrate holder is electrically biased in order to promote beta-silicon carbide heteroepitaxial growth on silicon.

6. A method as claimed in claim 5 wherein said substrate holder is electrically biased at a peak absolute value of not less than 200 V with respect to the filament.

7. A method as claimed in claim 1 wherein the reactant gas is maintained in the range of about 1 to 500 Torr.

8. A method as claimed in claim 4 wherein the substrate temperature is maintained in the range of about 600° to 1200° C.

9. A method as claimed in claim 1 further comprising the step of maintaining the deposition time in the range of about 5 to 90 min.

10. A method as claimed in claim 1 further comprising the step of maintaining the distance between graphite source and the filament in the range of about 1 to 20 mm.

11. A method as claimed in claim 1 further comprising the step of maintaining the distance between filament and the substrate in the range of about 1 to 20 mm.

12. A method as claimed in claim 1 wherein said carbon source is graphite.

13. A method as claimed in claim 12 wherein said graphite is in the form of a plate.

* * * * *